(12) United States Patent
Dogome et al.

(10) Patent No.: US 12,476,121 B2
(45) Date of Patent: *Nov. 18, 2025

(54) TRANSFER APPARATUS

(71) Applicant: Tokyo Electron Limited, Tokyo (JP)

(72) Inventors: Masahiro Dogome, Miyagi (JP); Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 12 days.

This patent is subject to a terminal disclaimer.

(21) Appl. No.: 18/600,829

(22) Filed: Mar. 11, 2024

(65) Prior Publication Data

US 2024/0213057 A1 Jun. 27, 2024

Related U.S. Application Data

(63) Continuation of application No. 17/563,850, filed on Dec. 28, 2021, now Pat. No. 11,948,816.

(30) Foreign Application Priority Data

Dec. 28, 2020 (JP) .................................. 2020-219040

(51) Int. Cl.
*H01L 21/67* (2006.01)
*H01L 21/677* (2006.01)
*H01L 21/687* (2006.01)

(52) U.S. Cl.
CPC .. *H01L 21/67196* (2013.01); *H01L 21/67742* (2013.01); *H01L 21/68764* (2013.01)

(58) Field of Classification Search
CPC ..... H01L 21/683; H01L 21/687; H01L 21/68; H01L 21/68721; H01L 21/68728; H01L 21/6875; H01L 21/67173; H01L 21/67748; H01L 21/67184; H01L 21/67196; H01L 21/68764; H01L 21/67742

See application file for complete search history.

(56) References Cited

U.S. PATENT DOCUMENTS 5,954,072 A 9/1999 Matusita
6,068,441 A 5/2000 Raaijmakers et al.
(Continued)

FOREIGN PATENT DOCUMENTS

JP 2012-216614 A 11/2012
JP 2017-005242 A 1/2017

*Primary Examiner* — Kaitlin S Joerger
(74) *Attorney, Agent, or Firm* — XSENSUS LLP

(57) ABSTRACT

A transfer apparatus includes a first vacuum transfer module; a first transfer robot disposed in the first vacuum transfer module and at least one ring. In addition, a second vacuum transfer module is provided; and a second transfer robot is disposed in the second vacuum transfer module. A tubular connecting module is disposed between the first vacuum transfer module and the second vacuum transfer module. Further, the first vacuum transfer module, the second vacuum transfer module and the tubular connecting module are arranged along a first direction, with the tubular connecting module having a first length in the first direction, and the first length is smaller than the diameter of the wafer. A wafer support is rotatably attached to the tubular connecting module and at least three ring supporting members outwardly extend from the wafer support to support the at least one ring.

20 Claims, 4 Drawing Sheets

(56) References Cited

U.S. PATENT DOCUMENTS

| | | |
|---|---|---|
| 6,168,427 B1 | 1/2001 | Cho et al. |
| 10,431,480 B2 | 10/2019 | Nguyen et al. |
| 10,522,381 B2 | 12/2019 | Ahamed et al. |
| 11,948,816 B2 * | 4/2024 | Dogome ........... H01L 21/67201 |
| 2003/0053904 A1 | 3/2003 | Kirihata et al. |
| 2003/0219333 A1 | 11/2003 | Takeuchi |
| 2004/0194817 A1 | 10/2004 | Pope et al. |
| 2007/0056514 A1 | 3/2007 | Akimoto et al. |
| 2007/0264106 A1 | 11/2007 | van der Meulen |
| 2007/0269297 A1 | 11/2007 | Meulen et al. |
| 2007/0286710 A1 | 12/2007 | van der Meulen et al. |
| 2008/0072823 A1 | 3/2008 | Yudovsky et al. |
| 2010/0001449 A1 | 1/2010 | Siebert et al. |
| 2010/0204820 A1 | 8/2010 | Finarov et al. |
| 2014/0003891 A1 | 1/2014 | Kobayashi |
| 2016/0186360 A1 | 6/2016 | Hirose et al. |
| 2017/0263491 A1 | 9/2017 | Muramoto |
| 2018/0147599 A1 | 5/2018 | Tanaka et al. |
| 2019/0013220 A1 | 1/2019 | Muramoto |
| 2019/0019706 A1 | 1/2019 | Takusari et al. |
| 2020/0321227 A1 | 10/2020 | Toyomaki |
| 2021/0272783 A1 | 9/2021 | Toyomaki |
| 2022/0018023 A1 | 1/2022 | Kuenle et al. |
| 2022/0059384 A1 | 2/2022 | Yoshino et al. |
| 2022/0208574 A1 | 6/2022 | Dogome et al. |
| 2022/0208576 A1 | 6/2022 | Dogome et al. |
| 2022/0213594 A1 | 7/2022 | Yamagishi |
| 2022/0216073 A1 | 7/2022 | Mori et al. |
| 2022/0277981 A1 | 9/2022 | Amikura et al. |
| 2023/0154771 A1 | 5/2023 | Yamagishi |

* cited by examiner

TRANSFER APPARATUS

CROSS-REFERENCE TO RELATED APPLICATIONS

This application is a continuation of U.S. patent application Ser. No. 17/563,850, filed on Dec. 28, 2021, which claims priority to Japanese Patent Application No. 2020-219040 filed on Dec. 28, 2020, the entire contents of each are incorporated herein by reference.

TECHNICAL FIELD

The present disclosure relates to a transfer apparatus.

BACKGROUND

U.S. Pat. No. 10,431,480 discloses a substrate processing apparatus or method for processing a substrate. A configuration in which two transfer modules, to which process modules are attached, are connected to perform substrate processing is disclosed as an example of an apparatus configuration. Further, U.S. Pat. No. 10,431,480 discloses a technique in which a rotation module (rotation mechanism) is provided and a substrate is rotated, if necessary.

SUMMARY

The technique of the present disclosure provides a transfer apparatus capable of suppressing an increase in footprint due to connection of vacuum transfer modules in the case of increasing a maximum number of processing modules to be attached in a vacuum transfer system by connecting the vacuum transfer modules and also capable of aligning a notch direction of a substrate during transfer of the substrate.

To this end, a transfer apparatus is provided. The apparatus comprises: a first vacuum transfer module; a first transfer robot disposed in the first vacuum transfer module and configured to simultaneously or separately transfer a wafer and at least one ring, the at least one ring having an inner diameter larger than the diameter of the wafer; a second vacuum transfer module; a second transfer robot disposed in the second vacuum transfer module and configured to simultaneously or separately transfer the wafer and the ring; a tubular connecting module disposed between the first vacuum transfer module and the second vacuum transfer module, the first vacuum transfer module, the second vacuum transfer module and the tubular connecting module being arranged along a first direction, the tubular connecting module having a first length in the first direction, the first length being smaller than the diameter of the wafer; a wafer support rotatably attached to the tubular connecting module and configured to support the wafer; and at least three ring supporting members outwardly extending from the wafer support and configured to support the at least one ring.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
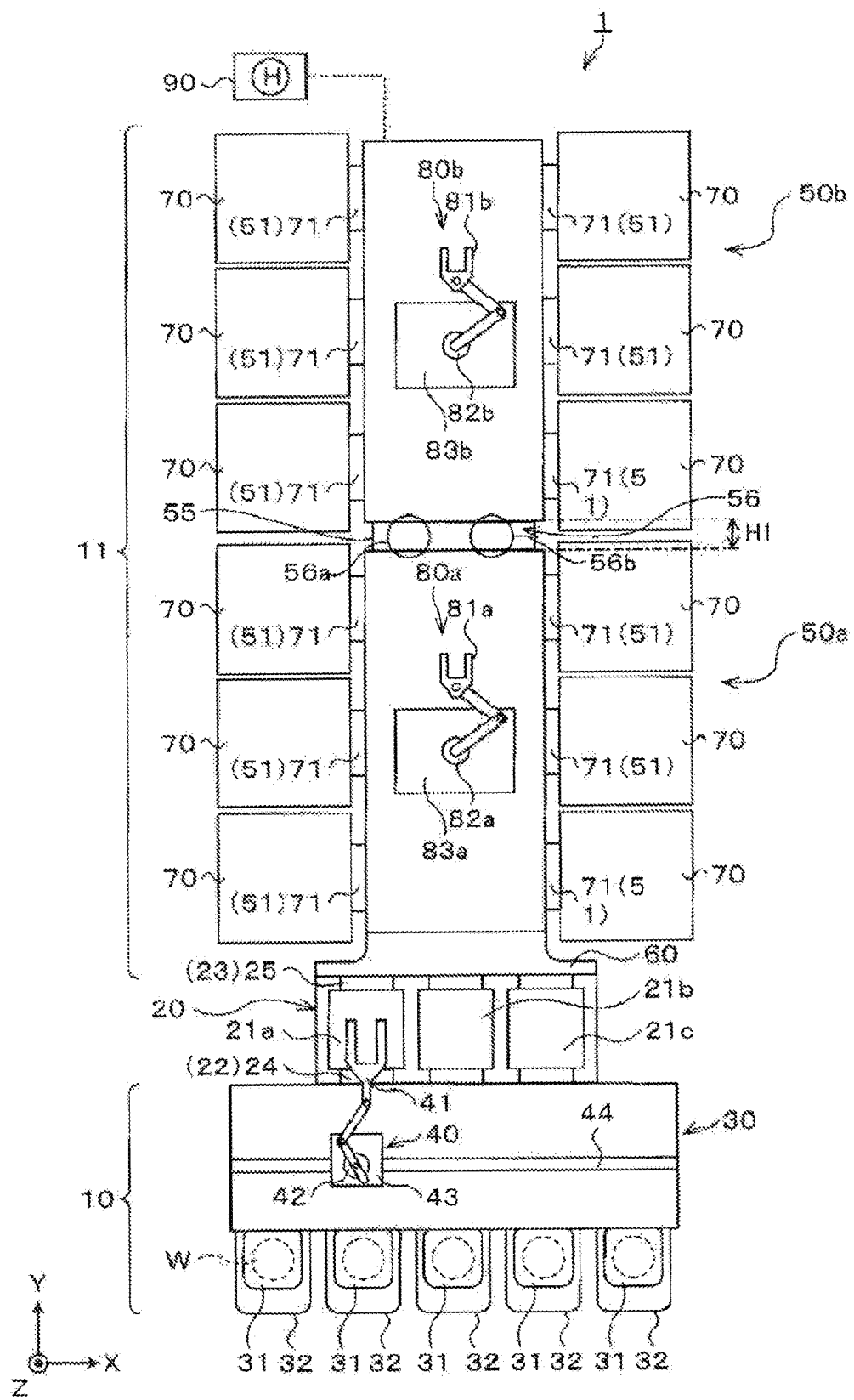
FIG. 1 is a plan view showing a schematic configuration of a wafer processing apparatus according to an embodiment.

In a semiconductor device manufacturing process, the inside of a processing module accommodating a semiconductor wafer (hereinafter, simply referred to as "wafer") is set to a depressurized (vacuum) state, and various processing steps are performed on the wafer. These processing steps are performed in a substrate processing apparatus (hereinafter, also referred to as "wafer processing apparatus") including a plurality of processing modules.

This wafer processing apparatus includes, e.g., an atmospheric part having an atmospheric module for performing desired processing on a wafer in an atmospheric atmosphere, and a depressurization (vacuum) part having a depressurization (vacuum) module for processing a wafer in a depressurized (vacuum) atmosphere. The atmospheric part and the depressurization part (vacuum part) are integrally connected with each other through a load-lock module having an inner atmosphere that can be switched between an atmospheric atmosphere and a depressurized (vacuum) atmosphere.

In the case of designing a wafer processing apparatus, as disclosed in U.S. Pat. No. 10,431,480, it may be required to attach a larger number of processing modules in view of a user's demand or efficiency of wafer processing.

However, in light of various demands such as reduction in footprint of a wafer processing apparatus, limitation of a transfer arm length, improvement of throughput in the wafer processing apparatus, and the like, further study on apparatus designs suitable for the case of increasing the number of processing modules needs to be conducted. For example, when a larger number of processing modules are attached to a vacuum transfer system, it is preferable to provide a passing module for connecting conventional vacuum transfer modules. However, certain drawbacks, such as an increase in the footprint due to the attachment of the passing module at that time, misalignment of the notch direction due to the transfer of the wafer in the passing module, and the like, occur.

In view of the above, the technique of the present disclosure provides a transfer apparatus including a passing module capable of suppressing an increase in footprint and aligning a notch direction of a wafer during transfer of the wafer. Hereinafter, a wafer processing apparatus as a transfer apparatus according to an embodiment will be described with reference to the accompanying drawings. Like reference numerals will be given to like components having substantially the same functions throughout this specification and the drawings, and redundant description thereof will be omitted.

<Configuration of Wafer Processing Apparatus>

First, a wafer processing apparatus according to an embodiment will be described. FIG. 1 is a plan view showing a schematic configuration of a wafer processing apparatus 1 according to an embodiment. In the present embodiment, a case where the wafer processing apparatus 1 includes a processing module for performing plasma processing, such as etching, film formation, diffusion, or the like, on a wafer W as a substrate will be described. The module configuration of the wafer processing apparatus 1 of the present disclosure is not limited thereto, and may be arbitrarily selected depending on purposes of wafer processing.

As shown in FIG. 1, the wafer processing apparatus 1 has a configuration in which an atmospheric part 10 and a depressurization part (vacuum part) 11 are integrally connected with each other through a load-lock module 20. The atmospheric part 10 includes an atmospheric module for processing and transferring the wafer W in an atmospheric atmosphere. The depressurization part (vacuum part) 11 includes a depressurization module (vacuum module) for processing and transferring the wafer W in a depressurized (vacuum) atmosphere.

The load-lock module 20 has a plurality of (e.g., three in the present embodiment) wafer transfer chambers 21a, 21b, and 21c arranged along a width direction (X-axis direction) of a loader module 30 to be described later and a fitting module 60 to be described later.

The wafer transfer chambers 21a, 21b, and 21c (hereinafter, they may be simply referred to as "wafer transfer chambers 21") as substrate transfer chambers allow the inner space of the loader module 30 (to be described later) in the atmospheric part 10 and the inner space of the transfer module 50a (to be described later) in the depressurization part 11 to communicate with each other through wafer transfer ports 22 and 23. The wafer transfer ports 22 and 23 can be opened and closed by gate valves 24 and 25, respectively.

The wafer transfer chambers 21 are configured to temporarily hold the wafer W. Further, the inner atmosphere of the wafer transfer chambers 21 can be switched between an atmospheric atmosphere and a depressurized atmosphere (vacuum state). In other words, the load-lock module 20 is configured to appropriately transfer the wafer W between the atmospheric part 10 in the atmospheric atmosphere and the depressurized part 11 in the depressurized atmosphere.

The atmospheric part 10 includes the loader module 30 having a wafer transfer mechanism 40 to be described later, and a load port 32 on which a FOUP 31 capable of storing a plurality of wafers W is placed. Further, an orientation module (not shown) for adjusting a horizontal direction of the wafer W, a storage module (not shown) for storing a plurality of wafers W, and the like may be disposed adjacent to the loader module 30.

The loader module 30 has a rectangular housing maintained in an atmospheric atmosphere. A plurality of, e.g., five load ports 32 are arranged side by side on one longitudinal side of the loader module 30 in a negative direction of the Y-axis. The wafer transfer chambers 21a, 21b, and 21c of the load-lock module 20 are arranged side by side on the other longitudinal side of the loader module 30 in a positive direction of the Y-axis.

The wafer transfer mechanism 40 for transferring the wafer W is disposed in the loader module 30. The wafer transfer mechanism 40 includes a transfer arm 41 for holding and moving the wafer W, a rotatable base 42 for rotatably supporting the transfer arm 41, and a rotatable table 43 on which the rotatable base 42 is placed. Further, a guide rail 44 extending in a longitudinal direction (X-axis direction) of the loader module 30 is disposed in the loader module 30. The rotatable table 43 is disposed on the guide rail 44, and the wafer transfer mechanism 40 is configured to be movable along the guide rail 44.

The depressurization part 11 includes two transfer modules 50a and 50b (hereinafter, referred to as a first transfer module (first vacuum transfer module) 50a and a second transfer module (second vacuum transfer module) 50b) for transferring the wafer W therein, a passing module (tubular connecting module) 55 that connects the two transfer modules 50a and 50b with each other, a fitting module 60 that connects the load-lock module 20 with the first transfer module 50a, and processing modules 70 for processing wafers W transferred from the transfer modules 50a and 50b. The inner atmosphere of the transfer modules 50a and 50b, the fitting module 60, and the processing modules 70 can be maintained in a depressurized (vacuum) atmosphere. In the present embodiment, a plurality of, e.g., six processing modules 70 are connected to one transfer module 50a (or 50b). The number and the arrangement of the processing modules 70 are not limited to those described in the present embodiment, and may be set in any appropriate manners.

The first transfer module 50a as a vacuum transfer module is connected to the load-lock module 20 through the fitting module 60, as described above. The first transfer module 50a and the second transfer module 50b transfer the wafer W loaded into the wafer transfer chamber 21a of the load-lock module 20 to one or a plurality of processing modules 70. After the wafer W is processed therein, it is transferred to the atmosphere part 10 through the wafer transfer chamber 21c of the load-lock module 20.

A first wafer transfer mechanism (first transfer robot) 80a as a first transfer mechanism for transferring the wafer W is disposed in the first transfer module 50a. The first wafer transfer mechanism 80a includes a transfer arm 81a for holding and moving the wafer W, a rotatable base 82a for rotatably supporting a transfer arm 81a, and a rotatable table 83a on which the rotatable base 82a is placed. The rotatable table 83a is fixed to a central portion of the first transfer module 50a. In one embodiment, the first transfer robot 80a is disposed in the first vacuum transfer module 50a and configured to transfer the wafer W and at least one ring ER1 simultaneously or separately.

The ring ER1 has an inner diameter smaller than the diameter of the wafer W. In one embodiment, at least one ring may be a plurality of rings ER1 and ER2. Each of the rings ER1 and ER2 has an inner diameter greater than the diameter of the wafer W. In this case, the first transfer robot 80a may transfer the plurality of rings ER1 and ER2 simultaneously or separately. In one embodiment, the plurality of rings ER1 and ER2 are edge rings used together in the plasma processing module 70. The plurality of edge rings ER1 and ER2 are arranged to surround the wafer W in the plasma processing module 70. In one embodiment, the plurality of edge rings ER1 and ER2 comprises a first edge ring ER1 and a second edge ring ER2, and the outer diameter of the second edge ring ER2 is greater than that of the first edge ring ER1. In one embodiment, the first edge ring ER1 is made of an Si material or an SiC material and the second edge ring ER2 is made of quartz. The first edge ring ER1 and the second edge ring ER2 may be made of the same material. For example, the first edge ring ER1 and the second edge ring ER2 may be made of quartz.

A second wafer transfer mechanism (second transfer robot) 80b as a second transfer mechanism for transferring the wafer W is disposed in the second transfer module 50b. The second wafer transfer mechanism 80b has the same function as that of the first wafer transfer mechanism 80a, and includes a mechanism such as a transfer arm 81b, a rotatable base 82b, and a rotatable table 83b. In one embodiment, the second transfer robot 80b is disposed in the second vacuum transfer module 50b and is configured to transfer the wafer W and at least one ring ER1 simultaneously or separately. When at least one ring comprises the plurality of rings ER1 and ER2, the second transfer robot 80b may transfer the plurality of rings ER1 and ER2 simultaneously or separately.

The processing modules 70 perform plasma processing, such as etching, film forming, diffusion, or the like, on the wafer W. Any module for performing processing can be selected as the processing modules 70 depending on purposes of wafer processing. Further, the processing modules 70 communicate with the transfer modules 50a and 50b through wafer transfer ports 51 formed on sidewalls of the transfer modules 50a and 50b, and the wafer transfer ports 51 can be opened and closed by gate valves 71.

As shown in FIG. 1, the wafer processing apparatus 1 configured described above includes a controller 90. The controller 90 is, e.g., a computer having a CPU, a memory, or the like, and includes a program storage (not shown). The program storage stores a program for controlling the transfer or the processing of the wafer W in the wafer processing apparatus 1. The program may be recorded in a computer-readable storage medium H and may be retrieved from the storage medium H and installed on the controller 90.

<Configuration of Each Module>

Figure 2:
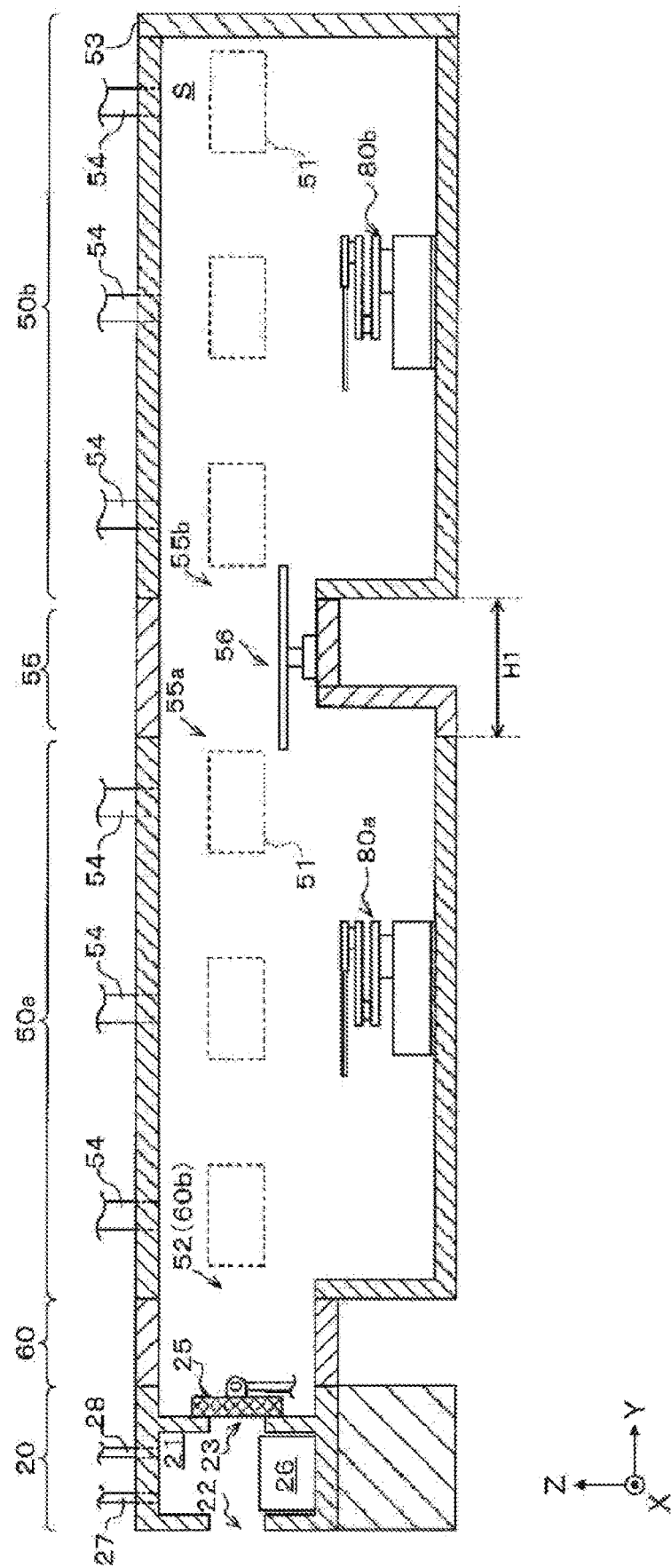
FIG. 2 is a vertical cross-sectional view showing a schematic configuration of a module according to an embodiment.

The wafer processing apparatus 1 according to the present embodiment is configured as described above. Next, the configuration of each module will be described in detail. FIG. 2 is a vertical cross-sectional view showing a schematic configuration of the load-lock module 20, the fitting module 60, the first transfer module 50a, the second transfer module 50b, and the passing module 55.

The load-lock module 20 has the three wafer transfer chambers 21a, 21b, and 21c arranged side by side along the width direction (X-axis direction) of the fitting module 60. In each of the three wafer transfer chambers 21, the wafer transfer port 22 for transferring the wafer W to and from the loader module 30 and the wafer transfer port 23 for transferring the wafer W to and from the first transfer module 50a are formed. In other words, three wafer transfer ports 22 and three wafer transfer ports 23 are formed on the sidewall of the load-lock module 20 on the negative side of the Y-axis and the sidewall of the load-lock module 20 on the positive side of the Y-axis, respectively.

The wafer transfer chambers 21 of the load-lock module 20 are connected to the loader module 30 and the first transfer module 50a through the gate valves 24 and the gate valves 25, respectively. The gate valves 24 and 25 ensure airtightness between the load-lock chambers 21 and the loader module 30 and between the load-lock chambers 21 and the transfer module 50, and communication therebetween.

As shown in FIG. 2, the wafer transfer chamber 21 is provided with a stocker 26 for temporarily holding the wafer W transferred between the loader module 30 and the transfer modules 50a and 50b.

Further, as shown in FIG. 2, an air supply port 27 for supplying a gas into the load-lock chamber 21 and a venting port 28 for venting a gas are connected to the load-lock module 20. The load-lock module 20 is configured such that the inner atmosphere of the load-lock chambers 21 can be switched between an atmospheric atmosphere and a depressurized atmosphere by the air supply port 27 and the venting port 28.

An opening 52, through which the wafer W is transferred to and from the fitting module 60, is formed at one end of the first transfer module 50 on the negative side of the Y-axis to which the fitting module 60 is connected. Further, the second transfer module 50b is connected to the other end of the first transfer module 50a on the positive side of the Y-axis through the passing module 55. In other words, the first transfer module 50a is connected to one end of the second transfer module 50b on the negative side of the Y-axis through the passing module 55, and the other end of the transfer module 50 on the positive side of the Y-axis is closed by an end plate 53 as a plate.

As illustrated, no plate-shaped member or gate valve is disposed between the transfer modules 50a and 50b, the passing module 55, and the fitting module 60. In other words, the inner spaces of the transfer modules 50a and 50b, the passing module 55, and the fitting module 60 communicate with each other, thereby defining an integrated transfer space S where the wafer W is transferred by the first wafer transfer mechanism 80a or the second wafer transfer mechanism 80b.

As described above, a plurality of wafer transfer ports 51 communicating with the processing modules 70 are formed on the longitudinal sides of the transfer modules 50a and 50b on the negative side and the positive side of the X-axis. The wafer transfer ports 51 can be opened and closed by the gate valves 71.

Further, gas supplies 54 for supplying an inert gas (e.g., N2 gas) to the transfer space S are connected to ceiling surfaces of the transfer modules 50a and 50b that are located above the wafer transfer ports 51. The gas supplies 54 supply an inert gas to the transfer space S to shut off the wafer transfer ports 51, i.e., to form an air curtain. Therefore, scattering of particles or the like from the wafer processing modules 70 into the transfer modules 50a and 50b at the time of opening the gate valves 71 is suppressed.

Further, the gas supplies 54 supply an inert gas into the transfer space S to eliminate stagnation of air flow in the transfer space S and appropriately exhaust the transfer space S using an exhaust mechanism (not shown) connected to the fitting module 60.

<Configuration of Passing Module>

Figure 3:
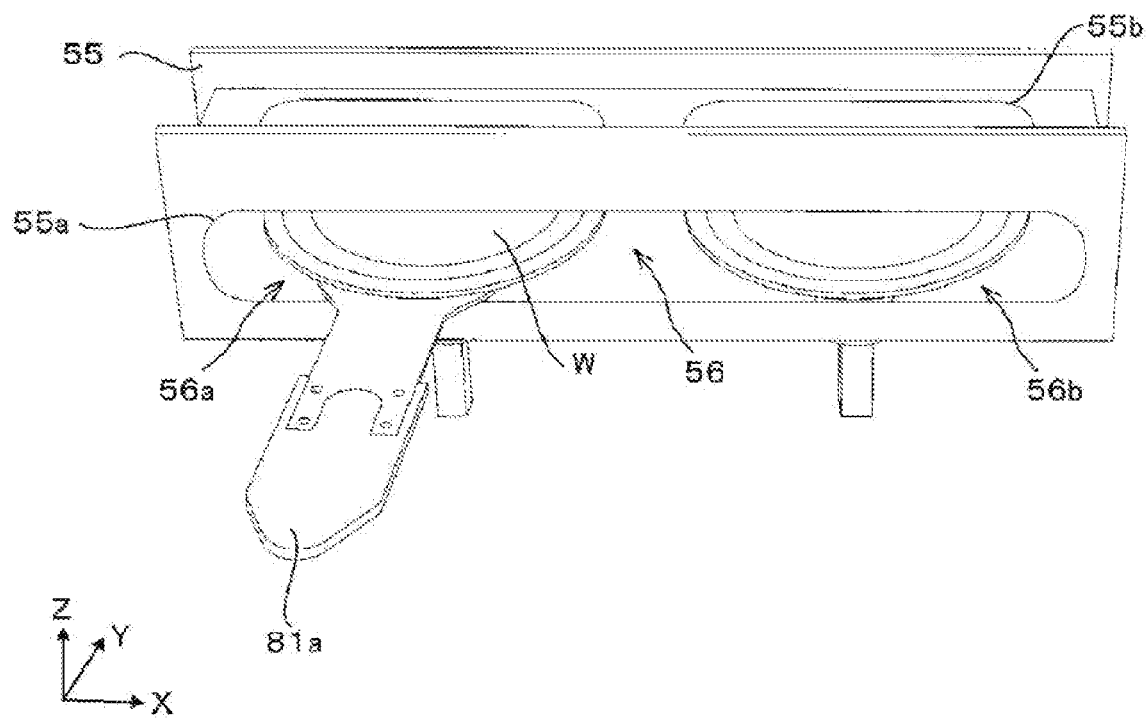
FIG. 3 is a perspective view showing a schematic configuration of a passing module according to an embodiment.

As described above, the passing module 55 connects the first transfer module 50a with the second transfer module 50b. The inner space of the passing module 55 and the inner spaces of the first transfer module 50a and the second transfer module 50b communicate with each other, and are set to a depressurized atmosphere during the transfer of the wafer W. FIG. 3 is a perspective view showing a schematic configuration of the passing module 55. FIG. 3 illustrates a state in which the wafer W is transferred into the passing module 55 by the wafer transfer mechanism 80a (the transfer arm 81a).

As shown in FIGS. 1 and 2, the load-lock module 20, the fitting module 60, the first transfer module 50a, the passing module 55, and the second transfer module 50b are connected side by side in that order from the negative side of the Y-axis.

Further, as shown in FIG. 3, the passing module 55 is formed in a tubular shape having a first opening 55a formed on one side surface connected to the first transfer module 50a (on the negative side of the Y-axis) and a second opening 55b formed on the other side surface connected to the second transfer module 50b (on the positive side of the Y-axis).

In the passing module 55 according to the embodiment, both the first opening 55a and the second opening 55b have a size that allows the wafer W to be appropriately transferred between the passing module 55 and the transfer modules 50a and 50b.

Further, the inner length H1 of the passing module 55 in the Y-axis direction is designed to be smaller than the diameter of the wafer W (the substrate dimension). However, the inner length H1 of the passing module 55 is designed to allow installation of rotation mechanisms 56a and 56b constituting a transfer part 56 to be described later. Further, the inner length H1 of the passing module 55 may be designed based on a clearance (gap) between the adjacent processing modules 70 near the passing module 55.

For example, in view of the overall footprint of the apparatus, the gap between the adjacent processing modules 70 is set to about 10 mm, and the inner length H1 of the passing module 55 is designed based on the gap. As such, the tubular connection module 55 is disposed between the first vacuum transfer module 50a and the second vacuum transfer module 50b. The first vacuum transfer module 50a, the second vacuum transfer module 50b, and the tubular connecting module 55 are arranged along the first direction Y. The tubular connecting module 55 has a first length H1 in a first direction Y. The first length H1 is smaller than the diameter of the wafer W.

As shown in FIG. 1, the passing module 55 is provided with the transfer part 56 for transferring the wafer W between the first transfer module 50a and the second transfer module 50b. As shown in FIG. 1, the transfer part 56 according to the embodiment includes two rotation mechanisms (wafer supports) 56a and 56b, and the rotation mechanisms 56a and 56b are arranged side by side in the width direction (X-axis direction) of the passing module 55.

Figure 4:
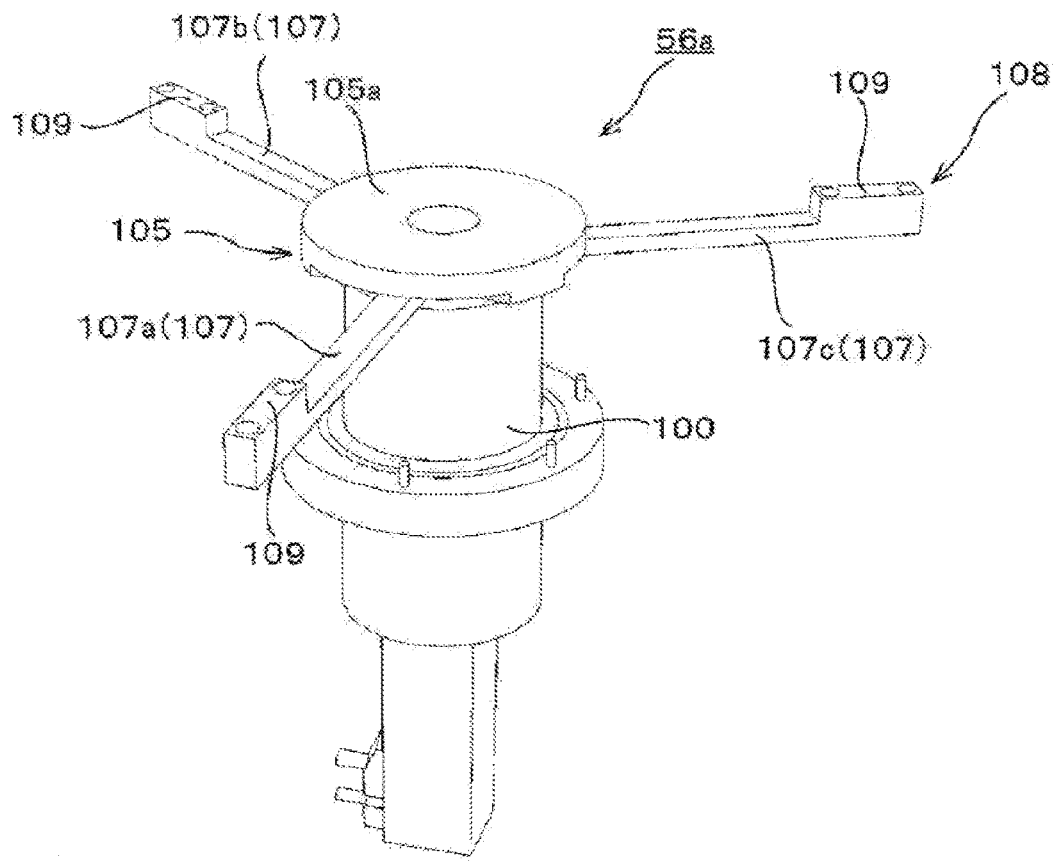
FIG. 4 schematically explains an example of a configuration of a rotation mechanism.

FIG. 4 schematically explains an example of the configuration of the rotation mechanisms 56a and 56b. Here, the rotation mechanism 56a is illustrated as an example, but the rotation mechanism 56b has the same configuration. As shown in FIG. 4, the rotation mechanism 56a includes a shaft member 100 including a driving shaft therein, a substrate support (wafer stage) 105 having a substrate support surface (wafer support surface) 105a at the upper end of the shaft member 100, and an edge ring support 108 having at least three rod-shaped holding members (ring supporting members) 107 extending outward at an outer periphery of the substrate support portion 105. In the configuration of FIG. 4, three holding members 107a, 107b, and 107c are arranged at intervals of 120° at the outer periphery of the substrate support 105.

The substrate support 105 is connected to the driving shaft (not shown) included in the shaft member 100, and is configured to be rotatable as the driving shaft is driven. The substrate support 105 is preferably designed to be in the passing module 55. Further, the edge ring support 108 may be configured to be non-rotatable, or may be configured to be rotatable while being connected to the driving shaft as in the case of the substrate support 105. In an example of the configuration, the substrate support 105 and the edge ring support 108 may rotate integrally or separately. The substrate support 105 or the edge ring support 108 may be detachable from the shaft member 100. By removing the substrate support 105 and the edge ring support 108, the efficiency of transfer or packaging of the apparatus can be improved.

The wafer W can be fixed and placed on the substrate support surface 105a of the substrate support 105 by a locking member such as an O-ring or the like. The substrate support surface 105a may be a disc-shaped member having a diameter smaller than that of the wafer W, and preferably has a dimension designed to be smaller than a fork width of the transfer arms 81a and 81b so that the wafer W can be transferred W to and from the transfer arms 81a and 81b.

Therefore, the wafer supports 56a and 56b are rotatably attached to the tubular connecting module 55 and are configured to support the wafers W. The wafer support 56a includes a wafer stage 105 and a shaft member 100. The wafer stage 105 has the wafer support surface 105a. The wafer support surface 105a has a diameter smaller than the first length H1. The shaft member 100 extends downward from the wafer stage 105. The wafer support 56b has the same configuration as that of the wafer support 56a.

An edge ring support surface 109 protruding upward may be formed at an outer tip end of the holding members 107. The substrate support surface 105a and the edge ring support surface 109 may have the same height level or may have different height levels. Therefore, at least three ring supporting members 107a, 107b, and 107c extend outward from the wafer support 56a and are configured to support at least one ring ER1 together. When at least one ring comprises the plurality of rings ER1 and ER2, the at least three ring supporting members 107a, 107b, and 107c are configured to support the plurality of rings ER1, ER2 together. The at least three ring supporting members 107a, 107b, and 107c comprise a first ring supporting member 107a and a second ring supporting member 107b. In one embodiment, the first ring supporting member 107a extends into the first vacuum transfer module 50a, and the second ring supporting member 107b extends into the second vacuum transfer module 50b. The at least three ring supporting members 107a, 107b, and 107c may be rotatable. In one embodiment, each of the ring supporting members 107a, 107b, and 107c includes a rod-shaped portion and a protruding portion. One end of the rod-shaped portion is attached to the shaft member 100. The protruding portion protrudes upward from the other end of the rod-shaped portion and has the ring support surface 109 at an upper end thereof. Further, it is preferable that the edge ring support surface 109 has a certain width in a radial direction of the rotation mechanism 56a. This is because it is required to support and rotate two types of rings having different diameters (e.g., a focus ring FR and a cover ring CR) as the edge ring ER on the edge ring support surface 109.

Figure 5:
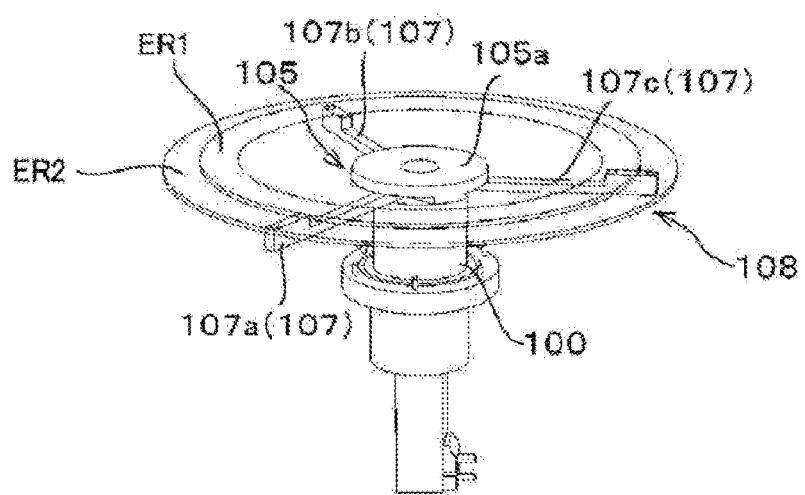
FIG. 5 schematically explains a state in which two types of edge rings having different diameters are placed on an edge ring support surface in a rotation mechanism.

FIG. 5 schematically explains a state in which two types of edge rings ER1 and ER2 having different diameters are placed on the edge ring support surface 109 in the rotation mechanisms 56a and 56b. The configuration of the present embodiment enables two types of edge rings ER1 and ER2 having different diameters to be simultaneously supported, held, or rotated on the edge ring support surface 109 as shown in FIG. 5.

Further, the focus ring FR is, e.g., a silicon member for performing positioning around the wafer W, and the cover ring CR is, e.g., a quartz member that covers the outer side of the focus ring FR. The edge ring ER is an annular member disposed to surround the periphery of the wafer W in the case of performing plasma processing on the wafer W. Here, the focus ring FR and the cover ring CR are collectively referred to as the edge ring ER.

As described above, it is preferable that the dimension of the substrate support 105 is designed to be smaller than the inner length H1 of the passing module 55. On the other hand, the overall dimension of the edge ring support 108 including the holding members 107 (107a to 107c) may be designed to be larger than the inner length H1 of the passing module 55. In that case, the tip end of the holding member 107 may extend into each of the transfer modules 50a and 50b.

<Wafer Transfer Method>

Next, an example of a method for transferring the wafer W through the passing module 55 in the wafer processing apparatus 1 according to the present embodiment will be described. For example, when the same wafer W is subjected to first substrate processing in the processing module 70 disposed on the side surface of the first transfer module 50*a* and then to second substrate processing in another processing module 70 disposed on the side surface of the second transfer module 50*b*, it is required to transfer the wafer W from the first transfer module 50*a* to the second transfer module 50*b*.

First, the first substrate processing is performed in the processing module 70 disposed on the side surface of the first transfer module 50*a* and, then, the wafer W is taken out from the processing module 70 by the first wafer transfer mechanism 80*a* (transfer arm 81*a*). Then, the wafer W is placed on the substrate support 105 of one of the rotation mechanisms 56*a* and 56*b* in the passing module 55.

Then, in a state where the wafer W is placed on the substrate support 105, the substrate support 105 and the wafer W are integrally rotated by a predetermined angle by the driving of the driving shaft included in the shaft member 100. After the rotation is completed, the wafer W is taken out from the substrate support 105 by the second wafer transfer mechanism 80*b* (transfer arm 81*b*). Then, the wafer W is directly transferred into the processing module 70 disposed on the side surface of the second transfer module 50*b* by the second wafer transfer mechanism 80*b*. Then, the second substrate processing is performed in the processing module 70 disposed on the side surface of the second transfer module 50*b*. Therefore, the controller 90 controls the first transfer robot 80*a* to place the wafer W on the wafer support 56*a*. Next, the controller 90 controls the wafer support 56*a* to rotate the wafer W on the wafer support 56*a* by a predetermined angle. Then, the controller 90 controls the second transfer robot 80*b* to transfer the wafer W on the wafer support 56*a* into the second vacuum transfer module 50*b*.

In the case of transferring a plurality of wafers W in a semiconductor device manufacturing process, it is required to transfer the wafers W such that the wafer W faces the same direction in the processing modules 70 in view of process characteristics or mass production. Therefore, it is preferable to control the wafer W to be transferred in the same direction in the processing modules 70 at transfer destination during both the transfer using the first wafer transfer mechanism 80*a* (transfer arm 81*a*) and the transfer using the second wafer transfer mechanism 80*b* (transfer arm 81*b*).

From the above perspective, a notch is formed at a predetermined position of the wafer W. When the wafer W is transferred to the processing modules 70 during substrate processing, it is required to control the wafer W to face the same direction in the processing modules 70 by aligning the notch direction of the wafer W. The wafer processing apparatus 1 according to the present embodiment has the configuration in which the first transfer module 50*a* and the second transfer module 50*b* are connected with each other through the passing module 55. Depending on the content of the substrate processing performed on the wafer W, it is necessary to transfer the same wafer W to the plurality of processing modules 70. In that case, it is required to transfer the same wafer W through the passing module 55.

In the configuration according to the present embodiment, since the passing module 55 through which the wafer W passes during transfer is provided with the rotation mechanisms 56*a* and 56*b*, the wafer W can be transferred from the first wafer transfer mechanism 80*a* to the second wafer transfer mechanism 80*b* while being rotated by a predetermined angle. Therefore, the wafer W can be transferred such that the notch direction of the wafer W faces the same direction in the processing modules 70 at the transfer destination. Accordingly, it is possible to make the substrate processing uniform and improve the throughput.

Although the method of transferring the wafer W has been described, the scope of application of the present disclosure is not limited thereto. In other words, when plasma processing is performed on the wafer W in the processing module 70 as in the wafer processing apparatus 1 according to the present embodiment, the edge ring ER can be transferred by a vacuum transfer part. As described above, the rotation mechanisms 56*a* and 56*b* include the edge ring support 108 for supporting the edge ring ER. Therefore, the edge ring ER can be rotated and transferred to the processing module 70 in a desired direction during the transfer of the edge ring ER as well as the transfer of the wafer W. Hence, the controller 90 controls the first transfer robot 80*a* to place at least one ring ER1 or ER2 on at least three ring supporting members 107*a*, 107*b*, and 107*c*. Then, the controller 90 controls the second transfer robot 80*b* to transfer at least one ring ER1 or ER2 on at least three ring supporting members 107*a*, 107*b* and 107*c* into the second vacuum transfer module 50*b*.

In accordance with the wafer processing apparatus 1 according to the present embodiment, when a larger number of processing modules 70 are attached to one vacuum transfer system in response to various requirements, the passing module 55 having an extremely small inner length (specifically, smaller than or equal to the diameter of the wafer W) is used to connect the conventional vacuum transfer modules (transfer modules 50*a* and 50*b*). Accordingly, it is possible to suppress an increase in footprint in the case of increasing the maximum number of processing modules 70 to be attached.

Further, in accordance with the wafer processing apparatus 1 according to the present embodiment, in the configuration in which the first transfer module 50*a* and the second transfer module 50*b* are connected with each other through the passing module 55 in order to increase the maximum number of processing modules 70 to be attached, the passing module 55 for transferring the wafer W is provided with the rotation mechanisms 56*a* and 56*b*. Accordingly, when the same wafer W is transferred from the first wafer transfer mechanism 80*a* to the second wafer transfer mechanism 80*b*, for example, the wafer W can be rotated by a desired angle and transferred. In other words, the wafer W can be transferred such that the notch direction of the wafer W faces the same direction in the processing modules 70 at the transfer destination, so that the improvement of the throughput or the like can be achieved. The embodiments of the present disclosure are illustrative in all respects and are not restrictive. The above-described embodiments may be omitted, replaced, or changed in various forms without departing from the scope of the appended claims and the gist thereof.

For example, the case in which the wafer processing apparatus 1 according to the above-described embodiment has the configuration including the two transfer modules 50*a* and 50*b* and the passing module 55 that connects them has been illustrated and described. However, the configuration of the apparatus is not limited thereto. In other words, it is also possible to employ a configuration in which three or more transfer modules 50 are connected by a plurality of passing modules 55, and a terminal portion thereof is closed by the end plate 53.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A transfer apparatus, comprising:
a first vacuum transfer module;
a first transfer robot disposed in the first vacuum transfer module;
a second vacuum transfer module;
a second transfer robot disposed in the second vacuum transfer module;
a connecting module disposed between the first vacuum transfer module and the second vacuum transfer module;
a wafer support disposed in the connecting module; and
a plurality of ring supporting members outwardly extending from the wafer support, the plurality of ring supporting members including a first ring supporting member and a second ring supporting member, the first ring supporting member extending into the first vacuum transfer module, the second ring supporting member extending into the second vacuum transfer module.

2. The transfer apparatus of claim 1, wherein the first vacuum transfer module, the second vacuum transfer module and the connecting module is arranged along a first direction, the connecting module having a first length in the first direction.

3. The transfer apparatus of claim 2, wherein the wafer support includes a wafer stage having a wafer support surface, and the wafer support surface has a diameter smaller than the first length.

4. The transfer apparatus of claim 1, wherein the wafer support is rotatable.

5. The transfer apparatus of claim 1, wherein the plurality of ring supporting members are rotatable.

6. The transfer apparatus of claim 4, wherein the plurality of ring supporting members are rotatable.

7. The transfer apparatus of claim 3, wherein the wafer support further includes a shaft member extending downward from the wafer stage, and
each of the plurality of ring supporting members includes a rod-shaped portion and a protruding portion, wherein one end of the rod-shaped portion is attached to the shaft member, and the protruding portion protrudes upward from the other end of the rod-shaped portion and has a ring support surface at an upper end thereof.

8. The transfer apparatus of claim 7, wherein the ring support surface is located at the same height as the wafer support surface.

9. The transfer apparatus of claim 7, wherein the ring support surface is located at a height different from the height of the wafer support surface.

10. The transfer apparatus of claim 7, wherein the plurality of ring supporting members include three ring supporting members arranged at intervals of 120° around the shaft member.

11. The transfer apparatus of claim 6, further comprising:
a controller configured to control the first transfer robot to place a wafer on the wafer support, control the wafer support to rotate the wafer on the wafer support by a predetermined angle, and control the second transfer robot to transfer the wafer on the wafer support into the second vacuum transfer module.

12. The transfer apparatus of claim 11, wherein the controller is configured to control the first transfer robot to place at least one ring on the plurality of ring supporting members, and control the second transfer robot to transfer the at least one ring on the plurality of ring supporting members into the second vacuum transfer module.

13. A transfer apparatus, comprising:
a first vacuum transfer module;
a first transfer robot disposed in the first vacuum transfer module;
a second vacuum transfer module;
a second transfer robot disposed in the second vacuum transfer module;
a connecting module disposed between the first vacuum transfer module and the second vacuum transfer module;
a wafer support disposed in the connecting module; and
a plurality of ring supporting members outwardly extending from the wafer support, the plurality of ring supporting members including a first ring supporting member extending into the first vacuum transfer module or the second vacuum transfer module.

14. The transfer apparatus of claim 13, wherein the first vacuum transfer module, the second vacuum transfer module and the connecting module is arranged along a first direction, the connecting module having a first length in the first direction.

15. The transfer apparatus of claim 14, wherein the wafer support includes a wafer stage having a wafer support surface, and the wafer support surface has a diameter smaller than the first length.

16. The transfer apparatus of claim 14, wherein the wafer support is rotatable.

17. The transfer apparatus of claim 16, wherein the plurality of ring supporting members are rotatable.

18. The transfer apparatus of claim 15, wherein the wafer support further includes a shaft member extending downward from the wafer stage, and
each of the plurality of ring supporting members includes a rod-shaped portion and a protruding portion, wherein one end of the rod-shaped portion is attached to the shaft member, and the protruding portion protrudes upward from the other end of the rod-shaped portion and has a ring support surface at an upper end thereof.

19. The transfer apparatus of claim 17, further comprising:
a controller configured to control the first transfer robot to place a wafer on the wafer support, control the wafer support to rotate the wafer on the wafer support by a predetermined angle, and control the second transfer robot to transfer the wafer on the wafer support into the second vacuum transfer module.

20. The transfer apparatus of claim 19, wherein the controller is configured to control the first transfer robot to place at least one ring on the plurality of ring supporting members, and control the second transfer robot to transfer the at least one ring on the plurality of ring supporting members into the second vacuum transfer module.

* * * * *